United States Patent
He et al.

(10) Patent No.: US 9,255,960 B2
(45) Date of Patent: Feb. 9, 2016

(54) TESTING STRUCTURE AND METHOD FOR INTERFACE TRAP DENSITY OF GATE OXIDE

(71) Applicant: PEKING UNIVERSITY, Beijing (CN)

(72) Inventors: Yandong He, Beijing (CN); Ganggang Zhang, Beijing (CN); Xiaoyan Liu, Beijing (CN); Xing Zhang, Beijing (CN)

(73) Assignee: Peking University, Beijing (CN)

( * ) Notice: Subject to any disclaimer, the term of this patent is extended or adjusted under 35 U.S.C. 154(b) by 178 days.

(21) Appl. No.: 14/350,442

(22) PCT Filed: Feb. 25, 2013

(86) PCT No.: PCT/CN2013/071846
§ 371 (c)(1),
(2) Date: Apr. 8, 2014

(87) PCT Pub. No.: WO2014/032416
PCT Pub. Date: Mar. 6, 2014

(65) Prior Publication Data
US 2014/0247067 A1    Sep. 4, 2014

(30) Foreign Application Priority Data

Aug. 29, 2012 (CN) .......................... 2012 1 0313870

(51) Int. Cl.
*G11C 7/00* (2006.01)
*G01R 31/26* (2014.01)
*H01L 21/66* (2006.01)

(52) U.S. Cl.
CPC ............ *G01R 31/2621* (2013.01); *H01L 22/14* (2013.01); *H01L 22/34* (2013.01); *H01L 2924/0002* (2013.01)

(58) Field of Classification Search
CPC ..................... G01R 31/2621; G01R 31/31924; H01L 22/14; H01L 22/34
USPC ......................................... 365/201; 324/762.1
See application file for complete search history.

(56) References Cited

U.S. PATENT DOCUMENTS 5,828,084 A * 10/1998 Noguchi ........... H01L 29/66742
                                                                       257/55
6,037,797 A *  3/2000 Lagowski .......... G01R 31/2648
                                                                       324/754.05

(Continued)

FOREIGN PATENT DOCUMENTS

CN          102353882          2/2012
CN          102520331          6/2012

(Continued)

OTHER PUBLICATIONS

He, Jin, Dependence of R-G current on bulk traps characteristics and silicon film structure in SOI gated-diode; 2011; 22(1); pp. 18-24. See ISR.

(Continued)

*Primary Examiner* — Viet Q Nguyen
(74) *Attorney, Agent, or Firm* — Stites & Harbison PLLC; Richard S. Myers, Jr.

(57) ABSTRACT

The present invention discloses a testing structure and method for interface trap density of gate oxide, relating to the field of quality and reliability researches of MOS devices. The present invention makes the interface traps density tests for gate oxide layers of n-type and p-type MOS devices completed on a same testing structure, this does not only shorten the measurement period by half but also decrease the costs for testing instruments, because the present testing method is based on a simple current-voltage scanning test without using equipments such as pulse generator required in conventional method. The testing results obtained according to the present invention are featured with spectral peak, which facilitates the data analysis and computation.

9 Claims, 4 Drawing Sheets

(56) References Cited

U.S. PATENT DOCUMENTS

| | | | | |
|---|---|---|---|---|
| 6,075,263 | A * | 6/2000 | Takahashi | H01L 22/34 257/284 |
| 6,172,368 | B1 * | 1/2001 | Tarr | G01T 1/026 250/337 |
| 6,275,059 | B1 * | 8/2001 | Sah | G01R 31/2621 324/762.05 |
| 6,391,668 | B1 * | 5/2002 | Chacon | H01L 22/14 257/E21.531 |
| 7,592,828 | B2 * | 9/2009 | Song | G01R 31/2648 324/762.01 |
| 7,859,289 | B2 * | 12/2010 | Chatterjee | G01R 31/2621 324/762.09 |
| 8,068,370 | B2 * | 11/2011 | Lue | G11C 16/0408 257/315 |
| 8,552,754 | B2 * | 10/2013 | Liu | G01R 31/2621 324/750.03 |
| 8,692,571 | B2 * | 4/2014 | Lai | G01R 31/31924 324/762.01 |
| 9,018,968 | B2 * | 4/2015 | Huang | 324/762.01 |
| 9,110,126 | B2 * | 8/2015 | Cao | G01R 31/2639 |
| 2008/0096292 | A1 | 4/2008 | Chatterjee et al. | |

FOREIGN PATENT DOCUMENTS

| | | |
|---|---|---|
| CN | 102522386 | 6/2012 |
| CN | 102832203 | 12/2012 |
| WO | 9845719 | 10/1998 |

OTHER PUBLICATIONS

Speckbacher, et al; The "Gated-Diode" Configuration in MOSFET's, A Sensitive Tool for Characterizing Hot-Carrier Degradation; IEEE Transactions on Electron Devices; vol. 42 (7); Jul. 1995; pp. 1287-1296.

Zhao, et al; "Gated-Diode" in SOI MOSFET's: A Sensitive Tool for Characterizing the Buried SI/SIO2 Interface; EEE Transactions on Electron Devices; vol. 48 (4); Apr. 2001; pp. 685-687.

He, et al.; Correlation between MR-DCIV Current and High-Voltage-Stress-Induced Degradation in LDMOSFETs; Proceedings of The 25th International Synposium on Power Semiconductor Devices & ICs, Kanazawa; pp. 383-386.

Neugroschel, et al; Direct-Current Measurements of Oxide and Interface Traps on Oxidized Silicon; IEEE Transactions on Electron Devices; vol. 42 (9); Sep. 1995; pp. 1657-1662.

Cai, et al.; monitoring Interface Traps by DCIV Method; IEEE Transactions on Electron Devices; vol. 20 (1); Jan. 1999; pp. 60-63.

He, et al.: Multiregion DCIV: A Sensitive Tool for Characterizing the SI/SIO2 Interfaces in LDMOSFETs; IEEE Transactions on Electron Devices; vol. 33 (10); Oct. 2012; pp. 1435-1437.

He, et al.; International Search Report and Written Opinion for PCT/CN2013/071846.

\* cited by examiner

TESTING STRUCTURE AND METHOD FOR INTERFACE TRAP DENSITY OF GATE OXIDE

CROSS REFERENCE TO RELATED APPLICATIONS

This application is a §371 National State Application of PCT/CN2013/071846 filed Feb. 25, 2013 which claims priority to CN 201210313870.5 filed Aug. 29, 2012.

FIELD OF THE INVENTION

The present invention relates to the field of quality and reliability researches of MOS devices, in particular to a testing structure and method for interface trap density of gate oxide.

BACKGROUND ART

With rapid development of semiconductor technology and substantial improvement of microelectronic chip integration level, the design and process for integrated circuit has entered a nano-scale era. The gate oxide, as a core of a MOS device, plays a pivotal role in the assessment of quality and reliability of the MOS devices. The generation of interface traps of the gate oxide layer decreases mobility of the device and degrades performance of the device. Therefore, it's necessary to monitor the interface traps of the gate oxide layer during the process flows. Commonly used testing structure for interface trap density of gate oxide measurement is an oxide capacitance structure or a MOSFET device, which is shown in FIG. 1a as a 2-terminal capacitor element structure including a gate and a substrate, and is shown in FIG. 1b as a 4-terminal MOSFET device structure including a source, a gate, a drain and a substrate, where Tox is the gate oxide thickness of the device. Conventional testing methods usually conduct measurements to gate oxide layer testing structures of n-type MOS device and p-type MOS device respectively, and a testing structure similar to that in FIG. 1a and FIG. 1b usually is a single gate oxide capacitor or a MOSFET device, therefore only measuring the densities of gate oxide interface trap on different testing structures can obtain both information on densities of interface traps for n-type MOS device and p-type MOS device involved in the CMOS integrated circuit technology. In addition, one existing CMOS process can provide multiple gate oxides with different thickness for design flexibility, which usually requires a considerable number of sample tests to obtain comprehensive information on quantity of gate oxide layer. This results in time-consuming measurement and low efficiency. Moreover, conventional testing methods require the use of instruments such as pulse generator, and hence result in high cost of test equipment.

SUMMARY OF THE INVENTION

Technical Problem to be Solved

The present invention intends to solve the technical problem of how to integrate the tests for the interface trap density of gate oxide layers in n-type and p-type MOS devices into a single test structure.

Technical Solution

In order to solve the problem above, the present invention provides a testing structure for interface trap density of gate oxide layer, comprising a gate oxide layer testing portion of p-type MOS device and a gate oxide layer testing portion of n-type MOS device, wherein the two testing portions share a common gate.

Preferably, the gate oxide layer testing portion of the p-type MOS device includes a gate oxide layer, a P-type emitter, and a P-type substrate of P-type MOS device; the gate oxide layer testing portion of n-type MOS device includes a gate oxide layer, a n-type emitter, and a n-type substrate of n-type MOS device; the gate oxide layer of p-type MOS device and the gate oxide layer of n-type MOS device are disposed in the same layer to constitute a gate oxide layer of the testing structure; the gate is disposed above the gate oxide layer of the testing structure, and the n-type emitter and the p-type emitter are disposed on two sides of the gate oxide layer of the testing structure, respectively; the n-type substrate and the p-type substrate constitute a substrate of the testing structure.

Preferably, a channel width of the testing structure is greater than a minimum channel width required by the process technology.

The present invention also provides a method for measuring interface trap density of gate oxide layer by using the testing structure according to the present invention, comprising:

S1, applying forward bias voltages between the n-type emitter and the substrate of the testing structure, and between the p-type emitter and the substrate of the testing structure, respectively; and S2, measuring a substrate current of the testing structure, and determining the interface trap density of the gate oxides in the p-type MOS device and the n-type MOS device according to the peak value of the measured substrate current.

Preferably, step S2 includes: changing the forward bias voltage between the n-type emitter and the substrate of the testing structure and the forward bias voltage between the p-type emitter and the substrate of the testing structure under the same testing temperature, so as to obtain different peak values of the substrate current; obtaining the peak values of substrate current by linear extrapolation in the cases that two kinds of the forward bias voltages with a value of zero, and dividing the two peak values by corresponding coefficients, respectively, to obtain the interface trap density of the gate oxide in the p-type MOS device and the n-type MOS device.

Preferably, the relation expression between the peak value of the substrate current and the forward bias voltage as follows:

$$\Delta I_{sub} = \frac{1}{2} q n_i \sigma v_{th} N_{it} A \exp\left(\frac{q|V_f|}{2K_B T}\right),$$

wherein A is the area of the testing structure, $\sigma$ is the capture cross-section of the interface traps, $v_{th}$ is the thermal velocity of electron, $V_f$ is the forward bias voltage between the n-type emitter or the p-type emitter and the substrate, $K_B$ is Boltzmann's constant, T is the testing temperature in Kelvin, $N_{it}$ is the interface trap density, q is the electron charge, $n_i$ is the concentration of an intrinsic semiconductor, and the corresponding coefficients are obtained according to the relation expression above.

Preferably, the area of the testing structure is equal to a product of the channel length and the channel width.

Preferably, the forward bias voltage between the n-type emitter and the substrate of the testing structure is a negative voltage, the forward bias voltage between the p-type emitter and the substrate of the testing structure is a positive voltage, and the positive voltage and the negative voltage have equal values.

Preferably, the forward bias voltage between the n-type emitter and the substrate of the testing structure, and the forward bias voltage between the P-type emitter and the substrate of the testing structure, both have an absolute value smaller than 0.7V.

Beneficial Effect

The technical solution described above is advantageous in that: with the present invention, the tests for the interface trap density of gate oxide for n-type and p-type MOS devices are integrated into a single testing structure without additional process steps or additionally increasing the number of pads, so that the area of the testing structure is decreased; the tests for interface trap density of gate oxide are conducted through a single IV measurement on the same structure, so that the measuring period is shortened and the test efficiency is improved; the DC-IV scanning test proposed by the present invention can obtain measurement results featured with peak values, and the peak current is proportion to the interface trap density of the gate oxide, which avoids uncertainty of the data and is beneficial for the data acquisition and analysis; a pulse signal generator is not required by using the DC-IV scanning test proposed by the present invention, which is required in the charge pump method, thus simplifying the settings of the test, making a conventional semiconductor parameter tester to meet the testing requirements, and saving costs for test equipment.

DETAILED DESCRIPTION OF EMBODIMENTS

Hereinafter the present invention will be described in details in combination with the accompanying drawings and the preferred embodiments. The embodiments below are illustrated for explaining the present invention only but not limiting the scope thereof.

The objective of the present invention is to provide a testing structure and method capable of measuring the interface trap density of gate oxide for both n-type and p-type MOS devices at the same time, which proposes a method of the interface trap density of gate oxide for n-type and p-type MOS devices to be conducted in the same testing structure. This may not only shorten the measurement period by half but also decrease the costs for testing instruments used in the conventional method, because the present testing method is based on a simple current-voltage scanning test without the use of equipments such as pulse generator. The testing results obtained according to the present invention are featured with spectral peak, which facilitates the data analysis and computation. Additionally, the testing structure according to the present invention is a four-terminal structure which can complete two tests at the same time, thus equivalently decreases the layout area of the testing structure and the test cost, so as to meet the cost-controlling requirements brought by sharp increase of manufacturing cost under advanced process nodes.

Figure 1A:
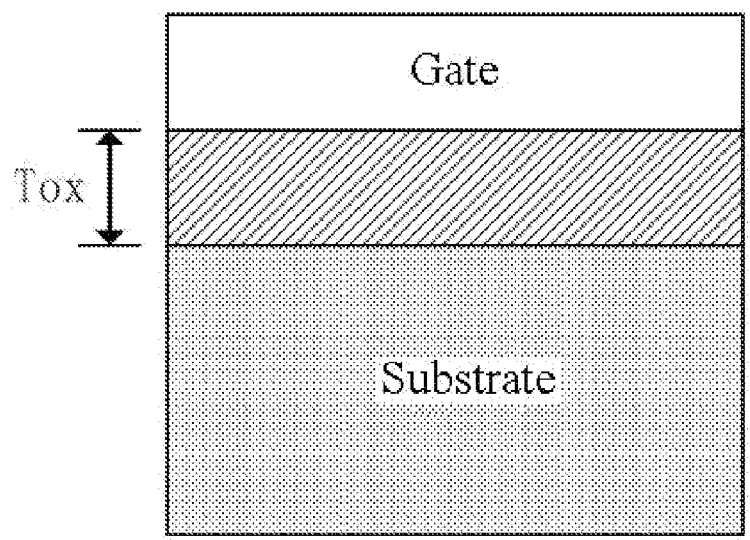
FIG. 1a is a schematic diagram showing a conventional testing structure for interface trap density of gate oxide.
Figure 1B:
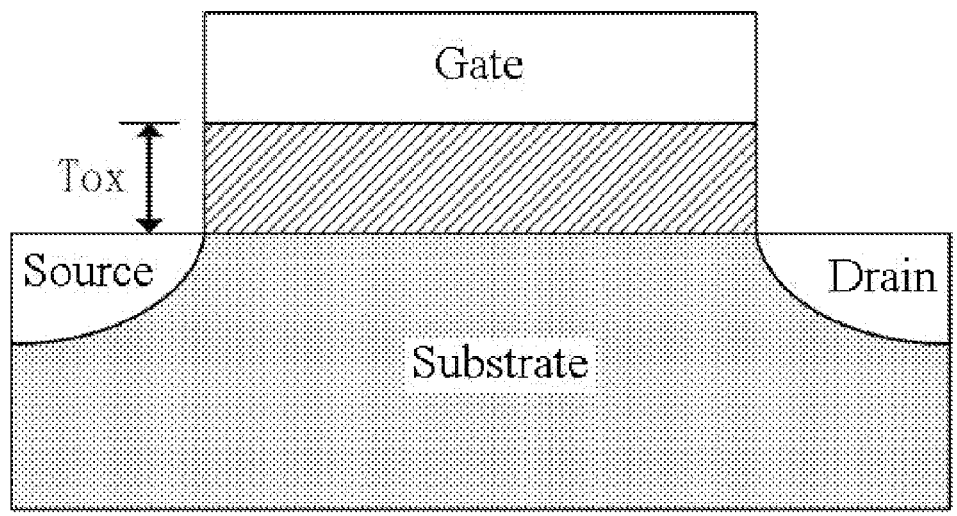
FIG. 1b is a schematic diagram showing another conventional testing structure for interface trap density of gate oxide.
Figure 2:
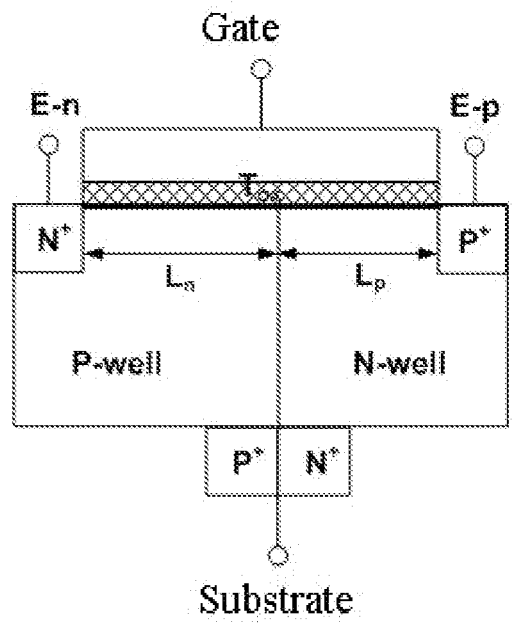
FIG. 2 is a schematic diagram showing a testing structure according to the present invention.

The present invention provides a testing structure capable of measuring the interface trap density of gate oxide in both n-type MOS device and p-type MOS device at the same time. Such testing structure combines conventional testing structures of n-type MOS device and p-type MOS device to constitute a four-terminal testing structure according to the present invention. As shown in FIG. 2, the four-terminal testing structure comprises a gate oxide layer testing portion of p-type MOS device and a gate oxide layer testing portion of n-type MOS device. The left side of the testing structure is the gate oxide layer testing portion of n-type MOS device, the n-type emitter E-n and n-type substrate of the gate oxide layer testing portion of n-type MOS device are formed by W and P-well. The right side of the testing structure is the gate oxide layer testing portion of p-type MOS device, the p-type emitter E-p and p-type substrate of the gate oxide layer testing portion of p-type MOS device are formed by $P^+$ and N-well. These two testing portions share a common gate, with the n-type emitter and p-type emitter being designed and prepared in a same way as the source and drain of conventional n-type and p-type MOS devices, to constitute a testing structure for interface trap density of gate oxide of both n-type and p-type MOS devices, wherein Ln and Lp are lengths of n-type and p-type gate oxide layers in the testing structure, respectively, which are in direct proportion to the number of interface traps of the gate oxide layer (which is in direct proportion to the testing area of the present structure, thus is also in direct proportion to the channel length, because the channel width is constant in value). In the test for density of interface traps of gate oxide layer, Ln and Lp shall be greater than or equal to a minimum channel length allowed by the process nodes, while the channel width shall be considerably greater than a fixed value of a minimum channel width. Each process node requires a minimum channel width, and the channel width of the testing structure according to the present invention needs to be much greater than the minimum channel width required by the process technology, e.g., 10 um. As shown in FIG. 2, Tox is the thickness of gate oxide layer of the testing structure, and for p-type and n-type testing structure portions, the thickness of gate oxide layer Tox may be any value compatible with the CMOS process.

The present invention also provides a method for measuring interface trap density of the gate oxide by using the testing structure mentioned-above, comprising the steps of:

S1, applying forward bias voltages between the n-type emitter and the substrate of the testing structure, and between the P-type emitter and the substrate of the testing structure, respectively;

S2, measuring a substrate current of the testing structure, and determining interface trap density of the gate oxide of P-type MOS device and n-type MOS device according to the measured peak values of the substrate current.

Figure 3:
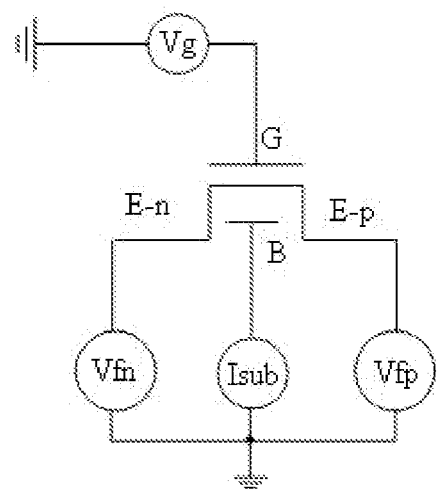
FIG. 3 is a schematic diagram showing the circuit connection for testing interface trap density of gate oxide by using the testing structure according to the present invention.

In the interface traps density test of gate oxide layer, it's required to apply forward bias voltages with an absolute value thereof smaller than 0.7V between the n-type emitter and the substrate, and between the P-type emitter and the substrate, respectively (the substrate is formed by connecting a P-well and a N-well, as shown in FIG. 2, thus it only needs to apply a scanning voltage to the gate). The scanning voltage applied to the gate ranges from the accumulation and weak inversion of the device, and cannot exceed the supply voltage so as to avoid high voltage damage to the gate oxide layer. FIG. 3 shows the testing setup of the structure, the substrate current is measured during applying the scanning voltage to the gate, and forward bias voltage is applied between the n-type emitter and the substrate, and between the p-type emitter and the substrate. The voltage Vfn formed between the n-type emitter and the substrate and the voltage Vfp formed between the p-type emitter and the substrate shall be equal in value and opposite in direction, i.e., Vfn is a negative voltage and Vfp is a positive voltage.

Figure 4:
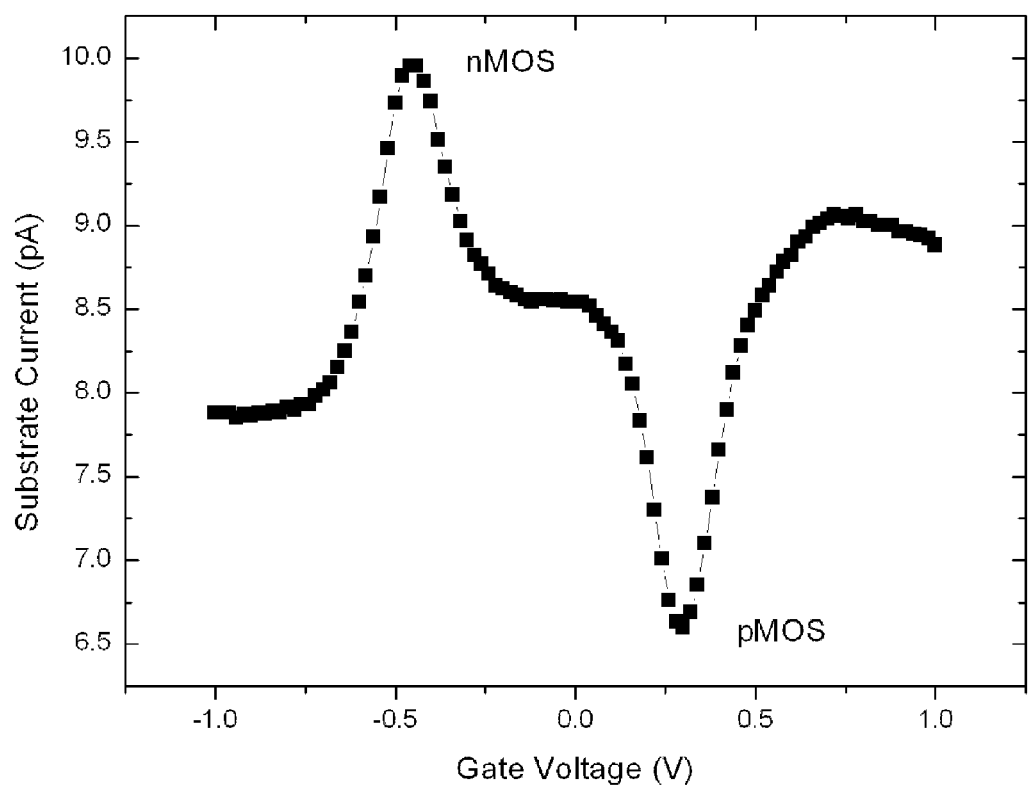
FIG. 4 is a diagram showing the testing results.

As for the testing structure of the present invention, according to Shockley-Read-Hall theory (a recombination theory named by the names of three scientists), when the gate voltage makes the concentrations of electrons and holes at the gate oxide interface equal with each other, the interface traps of the gate oxide layer, as a recombination center, generate a recombination current with the maximum value, i.e., representing peak features on the substrate current, as shown in FIG. 4.

Wherein, the peak value of the substrate current can be expressed as follows:

$$\Delta I_{sub} = \frac{1}{2} q n_i \sigma v_{th} N_{it} A \exp\left(\frac{q|V_f|}{2K_B T}\right) \quad (1)$$

wherein A is the area of the testing device (it equals to a product of channel length and channel width), σ is the capture cross-section of the interface traps (it's indicating the capturing capability of the traps to the charges), $v_{th}$ is the thermal velocity of electrons, $V_f$ is the forward bias voltage of n-type emitter and p-type emitter to the substrate, $K_B$ is Boltzmann's constant, T is the Kelvin temperature, $N_{it}$ is the interface trap density, q is the electron charge, and $n_i$ is the concentration of the intrinsic semiconductor, thus the peak value $\Delta I_{sub}$ of the substrate current $I_{sub}$ is exponentially dependent on the forward bias voltage. Since n-well and p-well are of opposite types, the peak values of substrate current will appear at variable locations. It can be seen from FIG. 5 that, within the scanning scope of the gate voltage Vg, the substrate current represents two peak values located at two sides of a point where the gate voltage is zero, with the two peaks being in opposite directions. Based on the analysis above, the heights of the two peaks are in direct proportion to interface trap density of gate oxide of n-type MOS device and p-type MOS device, respectively, so that the objective of measuring the interface trap density of gate oxide layers of n-type MOS device and p-type MOS device at the same time is achieved.

Figure 5:
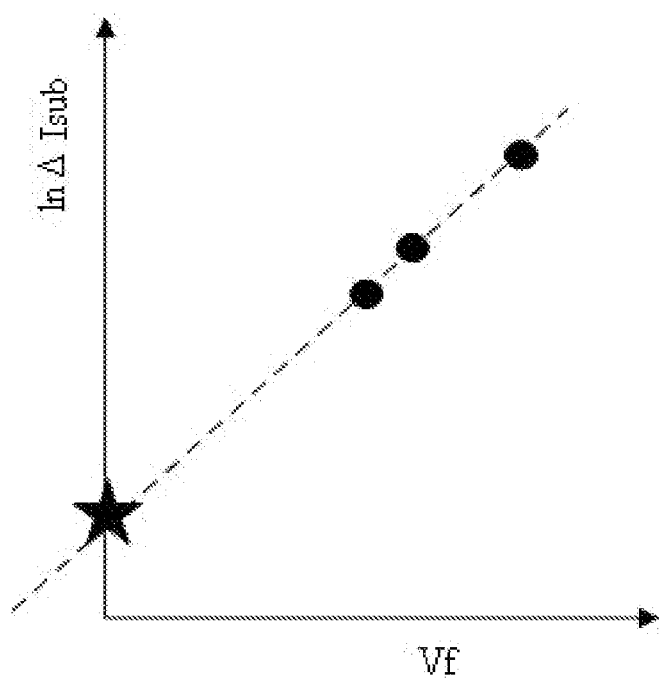
FIG. 5 is a schematic diagram illustrating a method for extracting interface trap density of gate oxide.

The interface trap density of gate oxide may be analyzed and obtained through the following way (i.e., particular implementations of the above step S2):
under the same temperature, changing the forward bias voltage to obtain different peak values of substrate current by measurement; obtaining a peak value of substrate current (as shown in FIG. 5) corresponding to a forward bias voltage of zero by linear extrapolation, and dividing the peak value by a corresponding coefficient to obtain the interface trap density ($N_{it}$) of gate oxide layer.

Thus it can be seen that, with the present invention, the interface traps density tests for gate oxide layers of n-type MOS device and p-type MOS device may be integrated into a single testing structure without additionally increasing the number of pads, so that the area of the testing structure is deceased; the tests for interface trap density of gate oxide layers are conducted through a single measurement on the same structure, so that the measuring period is shortened and the test efficiency is improved; the DC-IV scanning tests proposed by the present invention can get measurement results featured with peak values, and the peak current is in direct proportion to the interface traps density of the gate oxide layer, which reduces the data uncertainty and is beneficial for the data acquisition and analysis; the DC-IV scanning test proposed by the present invention eliminates the use of pulse signal generator usually used in the charge pump method, which simplifies the settings of the test and makes a conventional semiconductor parameter tester to meet the testing requirements, thus saving costs for test equipments.

The above embodiments are illustrated for explaining the present invention only but not limiting the scope thereof. Without departing from the spirit and scope of the present invention, a person skilled in the art can make various changes and modifications to these embodiments, therefore all equivalent technical solutions thereof shall also be fallen within the scope of the present invention, which defined by the appended claims.

INDUSTRIAL APPLICABILITY

The present invention provides a testing structure and method for interface trap density of gate oxide layer. With the present invention, the interface traps density tests for gate oxide layers of n-type MOS device and p-type MOS device are integrated into a single testing structure without introducing extra pads, so that the area of the testing structure is saved; the tests for densities of interface traps of gate oxide layers are conducted through a single measurement on the same structure, so that the measuring period is shortened and the test efficiency is improved; the DC-IV scanning test proposed by the present invention can output measurement results featured with peak values, and the peak current is directly proportional to the interface traps density of the gate oxide layer, which reduces the data uncertainty and is beneficial for the data acquisition and analysis; the DC-IV scanning test proposed by the present invention eliminate the use of pulse signal generator usually used in the charge pump method, which simplifies the settings of the test and makes a conventional semiconductor parameter tester to meet the testing requirements, thus saving costs for test equipments. Therefore, the present invention possesses industrial applicability.

What is claimed is:

1. A testing structure for interface trap density of gate oxide layer, comprising a gate oxide layer testing portion of p-type MOS device and a gate oxide layer testing portion of n-type MOS device, wherein the two testing portions share a common gate.

2. The testing structure according to claim 1, wherein the gate oxide layer testing portion of the p-type MOS device includes a gate oxide layer, a P-type emitter, and a P-type substrate of P-type MOS device; the gate oxide layer testing portion of n-type MOS device includes a gate oxide layer, a n-type emitter, and a n-type substrate of n-type MOS device; the gate oxide layer of p-type MOS device and the gate oxide layer of n-type MOS device are disposed in the same layer to constitute a gate oxide layer of the testing structure; the gate is disposed above the gate oxide layer of the testing structure, and the n-type emitter and the p-type emitter are disposed on two sides of the gate oxide layer of the testing structure, respectively; the n-type substrate and the p-type substrate constitute a substrate of the testing structure.

3. The testing structure according to claim 1, wherein a channel width of the testing structure is greater than a minimum channel width required by the process technology.

4. A method for measuring interface trap density of gate oxide layer by using the testing structure according to claim 1, comprising:
- S1, applying forward bias voltages between the n-type emitter and the substrate of the testing structure, and between the p-type emitter and the substrate of the testing structure, respectively; and
- S2, measuring a substrate current of the testing structure, and determining the interface trap density of the gate oxide layers of the p-type MOS device and the n-type MOS device according to the peak value of the measured substrate current.

5. The method according to claim 4, wherein step S2 includes:
- changing the forward bias voltage between the n-type emitter and the substrate of the testing structure and the forward bias voltage between the p-type emitter and the substrate of the testing structure under the same testing temperature, so as to obtain different peak values of the substrate current;
- obtaining the peak values of substrate current by linear extrapolation in the cases that two kinds of the forward bias voltages with a value of zero, and dividing the two peak values by corresponding coefficients, respectively, to obtain the densities of the interface traps of the gate oxide layers of the p-type MOS device and the n-type MOS device.

6. The method according to claim 5, wherein the relation expression between the peak value of the substrate current and the forward bias voltage as follows:

$$\Delta I_{sub} = \frac{1}{2} q n_i \sigma v_{th} N_{it} A \exp\left(\frac{q|V_f|}{2K_B T}\right),$$

wherein A is the area of the testing structure, σ is the capture cross-section of the interface traps, $v_{th}$ is the thermal velocity of electron, $V_f$ is the forward bias voltage between the n-type emitter or the p-type emitter and the substrate, $K_B$ is Boltzmann's constant, T is the testing temperature in Kelvin, $N_{it}$ is the interface trap density, q is the electron charge, $n_i$ is the concentration of an intrinsic semiconductor, and the corresponding coefficients are obtained according to the relation expression above.

7. The method according to claim 6, wherein the area of the testing structure is equal to a product of the channel length and the channel width.

8. The method according to claim 4, wherein the forward bias voltage between the n-type emitter and the substrate of the testing structure is a negative voltage, the forward bias voltage between the p-type emitter and the substrate of the testing structure is a positive voltage, and the positive voltage and the negative voltage have equal values.

9. The method according to claim 8, wherein the forward bias voltage between the n-type emitter and the substrate of the testing structure, and the forward bias voltage between the P-type emitter and the substrate of the testing structure, both have an absolute value smaller than 0.7V.

* * * * *